United States Patent
Maeda

(10) Patent No.: US 8,434,547 B2
(45) Date of Patent: May 7, 2013

(54) ELECTRONIC APPARATUS

(75) Inventor: Takashi Maeda, Kitakyushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 390 days.

(21) Appl. No.: 12/648,282

(22) Filed: Dec. 28, 2009

(65) Prior Publication Data
US 2010/0101766 A1    Apr. 29, 2010

Related U.S. Application Data

(63) Continuation of application No. PCT/JP2008/060678, filed on Jun. 11, 2008.

(30) Foreign Application Priority Data

Jul. 10, 2007    (JP) .................. 2007-180996

(51) Int. Cl.
- *F24H 3/02* (2006.01)
- *F24H 3/06* (2006.01)
- *H01L 23/467* (2006.01)
- *F28F 13/12* (2006.01)
- *H05K 7/20* (2006.01)

(52) U.S. Cl.
USPC ......... 165/121; 165/122; 165/80.2; 165/80.3; 361/697

(58) Field of Classification Search .................. 165/121, 165/122; 361/697
See application file for complete search history.

(56) References Cited

U.S. PATENT DOCUMENTS

| | | | | |
|---|---|---|---|---|
| 5,341,871 A | * | 8/1994 | Stelzer | 165/121 |
| 5,484,013 A | * | 1/1996 | Morikawa et al. | 165/80.3 |
| 5,699,854 A | * | 12/1997 | Hong | 165/121 |
| 5,927,386 A | * | 7/1999 | Lin | 165/80.3 |
| 6,302,189 B1 | * | 10/2001 | Lin et al. | 165/80.3 |
| 6,352,103 B1 | * | 3/2002 | Chu et al. | 165/80.3 |
| 6,587,342 B1 | * | 7/2003 | Hsu | 361/695 |
| 6,921,328 B1 | | 7/2005 | Nohara et al. | |
| 2003/0026074 A1 | * | 2/2003 | Clements et al. | 361/695 |
| 2005/0056401 A1 | * | 3/2005 | Saito et al. | 165/80.3 |
| 2008/0174958 A1 | * | 7/2008 | Horng | 361/695 |

FOREIGN PATENT DOCUMENTS

| | | |
|---|---|---|
| JP | 04-076096 | 7/1992 |
| JP | 05-006892 | 1/1993 |
| JP | 11-340665 | 12/1999 |
| JP | 2000-056861 | 2/2000 |
| JP | 2002-134972 | 5/2002 |

* cited by examiner

*Primary Examiner* — Mohammad M Ali
*Assistant Examiner* — Ian Soule
(74) *Attorney, Agent, or Firm* — Ditthavong Mori & Steiner, P.C.

(57) ABSTRACT

An electronic apparatus includes a heat sink for mounting a heating element, a cooling fan for supplying an airstream to the heat sink, and a housing for storing the heat sink and the cooling fan. The housing and the heat sink are equipped with a projection engaged with a hole of a flange of the cooling fan, and the cooling fan is sandwiched by the housing and the heat sink.

21 Claims, 3 Drawing Sheets

ELECTRONIC APPARATUS

CROSS-REFERENCE TO RELATED APPLICATIONS

The present application is a continuation application of PCT/JP2008/060678, filed Jun. 11, 2008, which claims priority to Japanese Patent Application No. 2007-180996, filed Jul. 10, 2007. The contents of these applications are incorporated herein by reference in their entirety.

BACKGROUND OF THE INVENTION

1. Field of the Invention

The present invention relates to an electronic apparatus equipped with a cooling fan.

2. Discussion of the Background

There is an electronic apparatus equipped with a cooling fan. In the electronic apparatus, a screw is passed through an attachment hole provided on the cooling fan and the screw is fixed to fix the cooling fan to a housing and a heat sink.

There is another electronic apparatus equipped with a cooling fan. In the electronic apparatus, the cooling fan is fixed without using a screw to avoid a complicated assembling operation.

For example in Japanese Laid-open Utility Model Publication No. 05-006892, it is described that flexibility of a material of a housing is used for fixing a cooling fan. That is, a plurality of pairs of fixing parts in which flexible projections and fixing projections are combined are provided to easily fix the cooling fan without using a fixing component such as a screw.

For example, in Japanese Laid-open Patent Publication No. 2002-134972, it is described that an electronic apparatus is equipped with a fan case supporting a cooling fan for supplying an airstream for cooling to a heat sink on which a heating element is mounted. The fan case has a superior wall and at least a pair of engaged parts that are bent down from opposing side ends of the upper wall. The fan case is fixed to the heat sink by using the engaged parts.

SUMMARY OF THE INVENTION

According to one aspect of the present invention, there is provided an electronic apparatus including a heat sink for mounting a heating element, a cooling fan for supplying an airstream to the heat sink, and a housing for storing the heat sink and the cooling fan. The housing and the heat sink are equipped with a projection engaged with a hole of a flange of the cooling fan, and the cooling fan is sandwiched by the housing and the heat sink.

According to another aspect of the invention, there is provided an electronic apparatus including a heat sink for mounting a heating element, a cooling fan for supplying an airstream to the heat sink, and a housing for storing the heat sink and the cooling fan. The housing and the heat sink are equipped with a projection engaged with a recess of a flange of the cooling fan, and the cooling fan is sandwiched by the housing and the heat sink.

BRIEF DESCRIPTION OF THE DRAWINGS

A more complete application of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
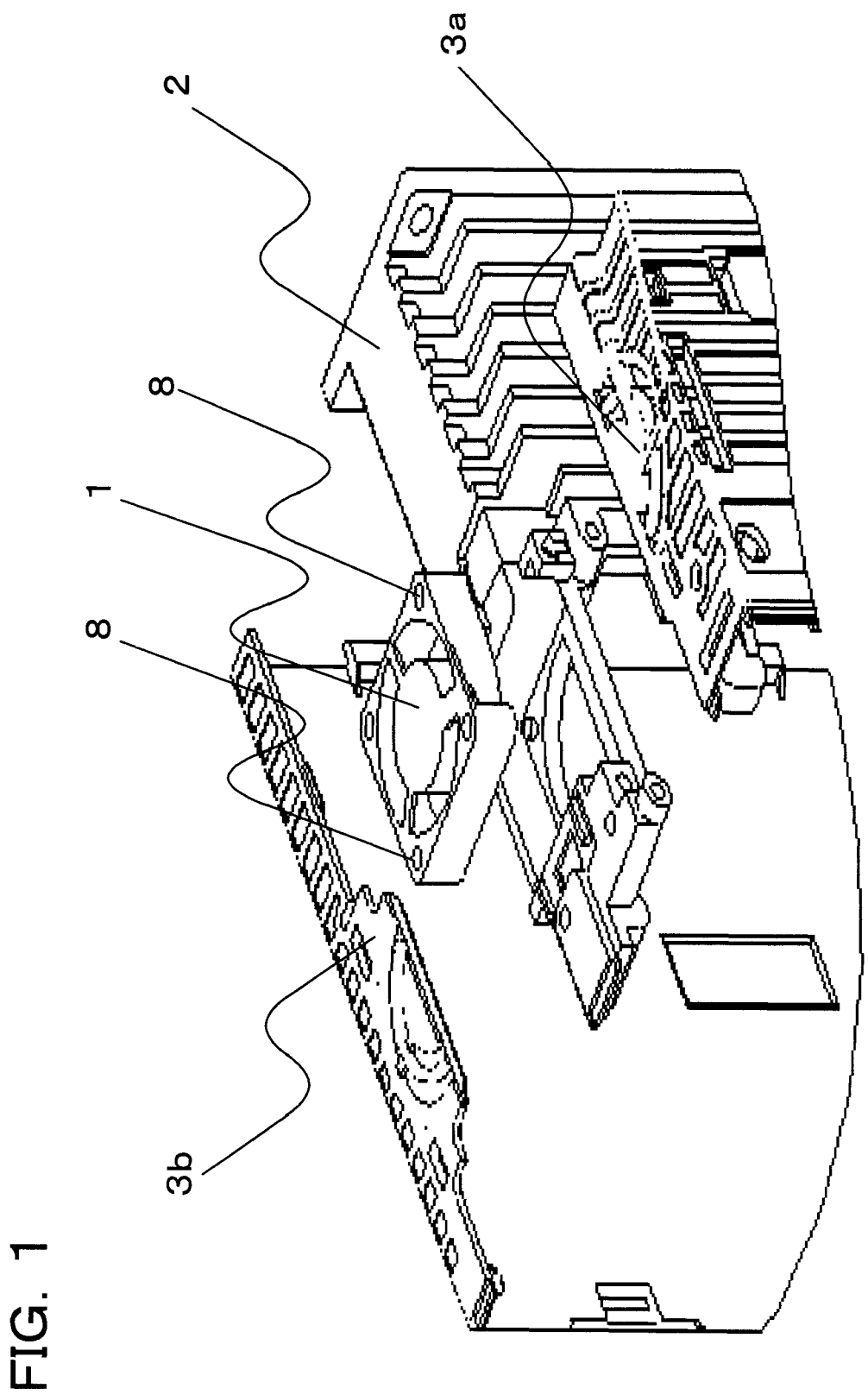
FIG. 1 is a conceptual diagram of a cooling fan attachment part of an electronic apparatus according to embodiments of the invention.

Embodiments will now be described with reference to the accompanying drawings, wherein like reference numerals designate corresponding or identical elements throughout the various drawings.

Hereinafter, the embodiments of the invention will be described with reference to the accompanying drawings.

FIG. 1 is a conceptual diagram of a cooling fan attachment part of an electronic apparatus according to the embodiments of the invention. In FIG. 1, the cooling fan attachment part of the electronic apparatus consists of a cooling fan 1, a heat sink 2, a housing (main body) 3a, a housing (cover) 3b, and attachment holes 8.

A heating element such as a power switching element is mounted on the heat sink 2.

The cooling fan 1 supplies an airstream for cooling to the heat sink 2. In general, a plurality of attachment holes 8 are formed in a flange of the cooling fan 1.

A housing is composed of the housing (main body) 3a and the housing (cover) 3b. The heat sink 2 and the cooling fan 1 are housed in the housing. A ventilation hole is formed on the housing (main body) 3a and the housing (cover) 3b so that an airstream for cooling flows. The cooling fan 1 is sandwiched and fixed by the heat sink 2 and the housing (main body) 3, and the heat sink 2 and the housing (cover) 3b.

Hereinafter, a first embodiment of the invention will be described with reference to the accompanying drawings.

Figure 2:
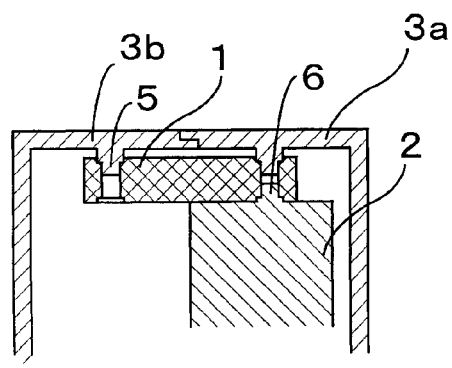
FIG. 2 is a cross sectional front view of a cooling fan attachment part according to a first embodiment.

FIG. 2 is a cross sectional front view of the cooling fan attachment part according to the first embodiment.

Figure 3:
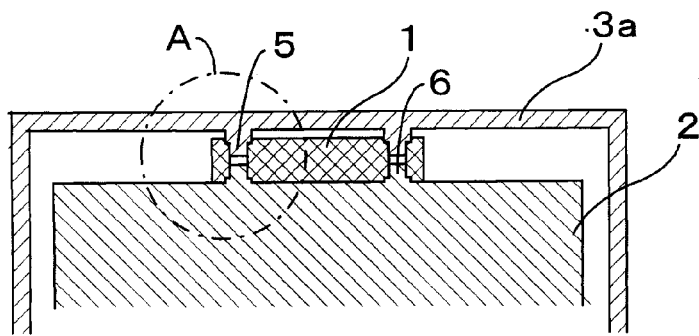
FIG. 3 is a cross sectional side view of the cooling fan attachment part according to the first embodiment.

FIG. 3 is a cross sectional side view of the cooling fan attachment part according to the first embodiment.

Figure 4:
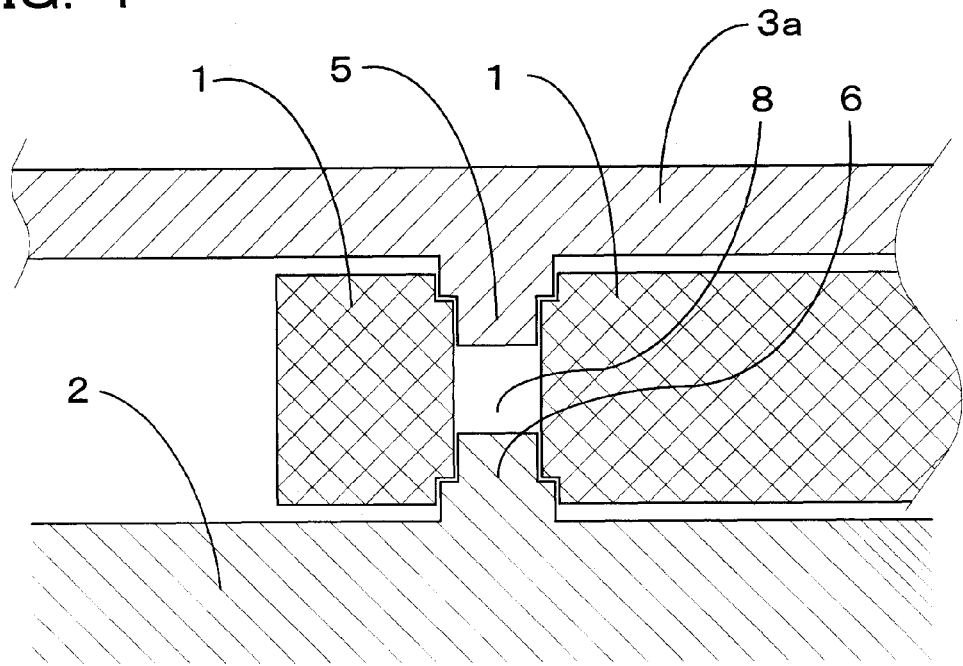
FIG. 4 is an enlarged view of part A of FIG. 3.

FIG. 4 is an enlarged view of part A of FIG. 3.

The housing (main body) 3 and the housing (cover) 3b have a projection 5. The projection 5 is formed to engage with the attachment hole 8 formed on the flange of the cooling fan 1.

The heat sink 2 has a projection 6. The projection 6 is formed to engage with the attachment hole 8 formed on the flange of the cooling fan 1.

The projection 6 of the heat sink 2 is engaged with the attachment hole 8 from the lower side of the cooling fan 1, and the projections 5 of the housing (main body) 3 and the housing (cover) 6 are engaged with the attachment holes 8 from the upper side of the cooling fan 1. Herewith, the cooling fan 1 is sandwiched by the housing and the heat sink to be fixed.

In the first embodiment, the projections (5, 6) engaged with the attachment holes 8 formed on the flange of the cooling fan 1 are formed on the housing (3a, 3b) and the heat sink 2, and the cooling fan 1 is sandwiched for fixation.

It is possible to form the projection 5 of the housing by attaching a projection on the housing by an adhesive agent or the like. However, it is preferable that the projection 5 of the housing is integrally formed with the housing.

It is also possible to form the projection 6 of the heat sink 2 by attaching a projection on the heat sink 2 by an adhesive agent or the like or by a fabrication. However, it is preferable that the projection 6 is integrally formed with the heat sink 2 when the heat sink 2 is formed by a die-cast method. The integral formation makes it possible to substantially eliminate the fabrication cost and enhance the strength.

In the first embodiment, it is not necessary to deform a member for attaching the cooling fan. Consequently, it is not necessary to select a material for the member, the structure for attaching the cooling fan is simple, and assembling is easy.

In the first embodiment, since the projections (5, 6) are integrally formed with the housing and the heat sink, no special member for attaching the cooling fan is necessary and the cost can be reduced.

In the first embodiment, the projection 5 of the housing and the projection 6 of the heat sink are engaged with the attachment holes 8 of the flange of the cooling fan 1. However a recess of the flange of the cooling fan 1 can be also engaged with the projection provided on the housing and the heat sink. Accordingly, instead of the attachment hole 8, any structure can be employed as far as a force operated in parallel with the flange face can be absorbed.

Hereinafter, a second embodiment of the invention will be described with reference to the accompanying drawings.

Figure 5:
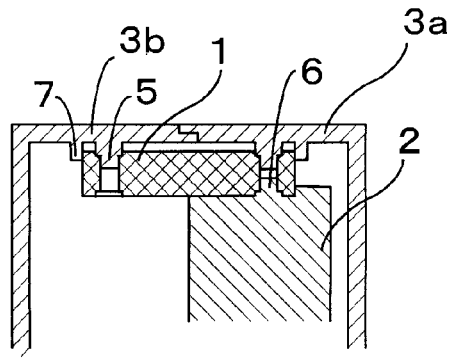
FIG. 5 is a cross sectional front view of a cooling fan attachment part according to a second embodiment.

FIG. 5 is a cross sectional front view of a cooling fan attachment part according to the second embodiment.

Figure 6:
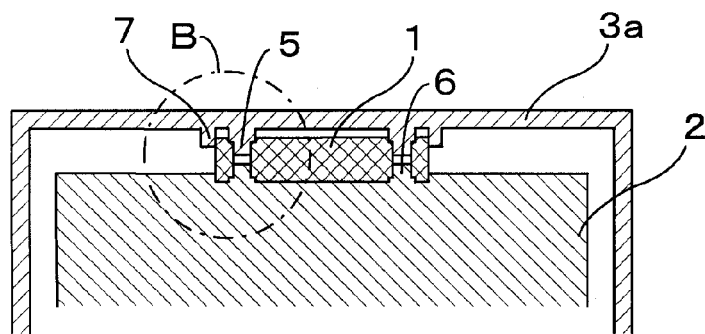
FIG. 6 is a cross sectional side view of the cooling fan attachment part according to the second embodiment.

FIG. 6 is a cross sectional side view of the cooling fan attachment part according to the second embodiment.

Figure 7:
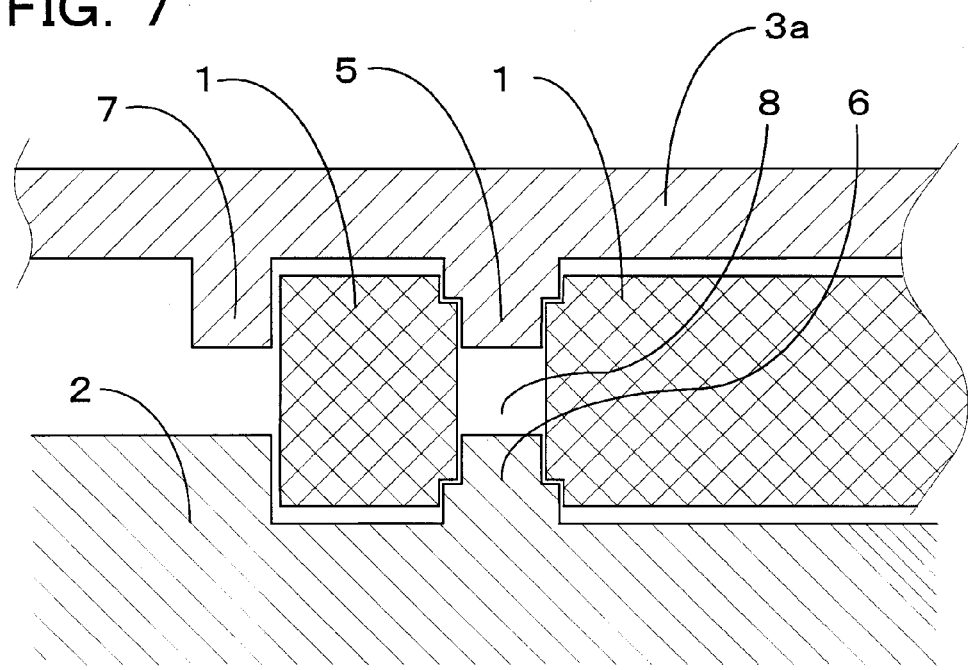
FIG. 7 is an enlarged view of part B of FIG. 6.

FIG. 7 is an enlarged view of part B of FIG. 6.

In FIG. 5, the housing (main body) 3 and the housing (cover) 3b have a holder 7 so that the outer shape of the cooling fan 1 is fitted.

The heat sink 2 has a recess so that a part of the outer shape of the cooling fan 1 is engaged.

The second embodiment is different from the first embodiment in the points that the holder 7 is formed on the housing 3 and the recess is formed on the heat sink 2 so that the outer shape of the cooling fan 1 is fitted thereto. With the holder 7, the cooling fan 1 can be fixed more firmly and stably.

The projection 6 of the heat sink 2 is engaged with the attachment hole 8 from the lower side of the cooling fan 1, and the projections 5 of the housing (main body) 3 and the housing (cover) 6 are engaged with the attachment holes 8 from the upper side of the cooling fan 1. Herewith, the cooling fan 1 is sandwiched by the housing and the heat sink to be fixed.

The outer shape of the cooling fan 1 is fitted with the holder 7 formed on the housing (main body) 3a and the housing (cover) 3b and the recess formed on the heat sink 2.

It is possible to form the projection 5 and the holder 7 of the housing by attaching projections on the housing by an adhesive agent or the like. However, it is preferable that the projection 5 and the holder 7 of the housing are integrally formed with the housing.

It is also possible to form the projection 6 of the heat sink 2 by attaching a projection on the heat sink 2 by an adhesive agent or the like or by a fabrication. However, it is preferable that the projection 6 is integrally formed with the heat sink 2 when the heat sink 2 is formed by a die-cast method.

It is also possible to form the recess of the heat sink by a fabrication. However, it is preferable that the recess is integrally formed with the heat sink 2 when the heat sink 2 is formed by a die-cast method. The integral formation makes it possible to substantially eliminate the fabrication cost and enhance the strength.

In the second embodiment, it is not necessary to deform a member for attaching the cooling fan. Consequently, it is not necessary to select a material for the member, the structure for attaching the cooling fan is simple, and assembling is easy.

In the second embodiment, since the projections (5, 6), holder 7, and the recess are integrally formed with the housing and the heat sink, no special member for attaching the cooling fan is necessary and the cost can be reduced.

In the second embodiment, the projection 5 of the housing and the projection 6 of the heat sink are engaged with the attachment holes 8 of the flange of the cooling fan 1. However a recess of the flange of the cooling fan 1 can be also engaged with the projection provided on the housing and the heat sink. Accordingly, instead of the attachment hole 8, any structure can be employed as far as a force operated in parallel with the flange face can be absorbed.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United State is:

1. An electronic apparatus comprising:
    a heat sink configured to mount a heating element and having an outer surface, the heat sink comprising a first projection projected from the outer surface;
    a cooling fan configured to supply an airstream to the heat sink and comprising a fan housing having a first surface and a second surface opposite to the first surface, the first surface facing the outer surface of the heat sink, the fan housing including a first hole formed on the first surface, and a second hole formed on the second surface, the first projection being provided in the first hole; and
    a housing of the electronic apparatus, the housing having an inner surface and comprising a second projection projected from the inner surface, the inner surface facing the second surface, the second projection being provided in the second hole, the housing containing the heat sink and the fan housing within the housing,
    wherein the housing includes a first part and a second part, the first part and the second part being separate from one another, the second projection being provided on the first part, the housing further comprising a third projection projecting from the inner surface of the second part, and
    wherein the fan housing includes a third hole formed on the second surface, the third projection being provided in the third hole.

2. The electronic apparatus according to claim 1, wherein the second projection of the housing is integrally formed with the housing as a one-piece unitary member, and wherein the first projection of the heat sink is integrally formed with the heat sink as a one-piece unitary member.

3. The electronic apparatus according to claim 1, wherein the housing includes a holder in contact with at least a part of an outer shape of the cooling fan, and wherein the holder is integrally formed with the housing as a one-piece unitary member.

4. The electronic apparatus according to claim 1, wherein the heat sink includes a recessed portion in contact with at least a part of an outer shape of the cooling fan, the cooling fan being provided in the recessed portion, and wherein the recessed portion of the heat sink is integrally formed with the heat sink as a one-piece unitary member.

5. An electronic apparatus comprising:
    a heat sink configured to mount a heating element and having an outer surface, the heat sink comprising a first projection projected from the outer surface;

a cooling fan configured to supply an airstream to the heat sink and comprising a fan housing having a first surface and a second surface opposite to the first surface, the first surface facing the outer surface of the heat sink, the fan housing including a first recess formed on the first surface, and a second recess formed on the second surface, the first projection being provided in the first recess; and a housing of the electronic apparatus, the housing having an inner surface and comprising a second projection projected from the inner surface, the inner surface facing the second surface, the second projection being provided in the second recess, the housing containing the heat sink and the fan housing within the housing, wherein the housing includes a first part and a second part, the first part and the second part being separate from one another, the second projection being provided on the first part, the housing further comprising a third projection projecting from the inner surface of the second part, and wherein the fan housing includes a third recess formed on the second surface, the third projection being provided in the third recess.

6. The electronic apparatus according to claim 5, wherein the second projection of the housing is integrally formed with the housing as a one-piece unitary member, and wherein the first projection of the heat sink is integrally formed with the heat sink as a one-piece unitary member.

7. The electronic apparatus according to claim 5, wherein the housing includes a holder in contact with at least a part of an outer shape of the cooling fan, and wherein the holder is integrally formed with the housing as a one-piece unitary member.

8. The electronic apparatus according to claim 5, wherein the heat sink includes a recessed portion in contact with at least a part of an outer shape of the cooling fan, the cooling fan being provided in the recessed portion, and wherein the recessed portion of the heat sink is integrally formed with the heat sink as a one-piece unitary member.

9. An electronic apparatus comprising:
a heat sink configured to mount a heating element and having an outer surface, the heat sink comprising a first projection projected from the outer surface;
a cooling fan configured to supply an airstream to the heat sink and comprising a fan housing having a first surface and a second surface opposite to the first surface, the first surface facing the outer surface of the heat sink, the fan housing including a hole formed on the first surface, and a recess formed on the second surface, the first projection being provided in one of the hole and the recess; and
a housing of the electronic apparatus, the housing having an inner surface and comprising a second projection projected from the inner surface, the inner surface facing the second surface, the second projection being provided in another of the hole and the recess, the housing containing the heat sink and the fan housing within the housing,
wherein the housing includes a first part and a second part, the first part and the second part being separate from one another, the second projection being provided on the first part, the housing further comprising a third projection projecting from the inner surface of the second part, and
wherein the fan housing includes an additional hole formed on the second surface, the third projection being provided in the additional hole.

10. The electronic apparatus according to claim 9, wherein the second projection of the housing is integrally formed with the housing as a one-piece unitary member, and wherein the first projection of the heat sink is integrally formed with the heat sink as a one-piece unitary member.

11. The electronic apparatus according to claim 9, wherein the housing includes a holder in contact with at least a part of an outer shape of the cooling fan, and wherein the holder is integrally formed with the housing as a one-piece unitary member.

12. The electronic apparatus according to claim 9, wherein the heat sink includes a recessed portion in contact with at least a part of an outer shape of the cooling fan, the cooling fan being provided in the recessed portion, and wherein the recessed portion of the heat sink is integrally formed with the heat sink as a one-piece unitary member.

13. The electronic apparatus according to claim 1, wherein
the fan housing includes a first recess and a second recess, the first recess being provided around the first hole, the second recess being provided around the second hole,
the second projection of the housing is provided in the second recess, and
the first projection of the heat sink and being provided in the first recess.

14. The electronic apparatus according to claim 13, wherein
the first projection of the heat sink is in contact with a bottom face of the first recess, and
the second projection of the housing is in contact with a bottom face of the second recess.

15. The electronic apparatus according to claim 5, wherein
the second projection of the housing is in contact with a bottom face of the second recess,
the first projection of the heat sink is in contact with a bottom face of the first recess.

16. The electronic apparatus according to claim 9, wherein
the second projection of the housing is provided in the recess and is in contact with a bottom face of the recess, and
the first projection of the heat sink is provided in the hole.

17. The electronic apparatus according to claim 9, wherein
the second projection of the housing is provided in the hole, and
the first projection of the heat sink is provided in the recess and is in contact with a bottom face of the recess.

18. The electronic apparatus according to claim 1,
wherein the fan housing includes a third hole formed on the first surface, and
wherein no projection is provided in the third hole.

19. The electronic apparatus according to claim 18,
wherein the fan housing includes a fourth hole formed on the second surface, the third hole and the fourth holes being connected through the fan housing, and
wherein the housing further comprising a third projection projecting from the inner surface, the third projection being provided in the fourth hole.

20. The electronic apparatus according to claim 1,
wherein the housing includes a first wall on which the second projection is provided, the first wall extending over the cooling fan and the heat sink,
wherein the housing further includes a second wall provided on a lateral side of the cooling fan and the heat sink, and
wherein the housing further includes a third wall provided on an opposite side of the cooling fan and the heat sink with respect to the second wall.

21. The electronic apparatus according to claim 1, wherein the housing further comprises a protruding holder portion that protrudes from the inner surface and is fitted with a side surface of the fan housing.

* * * * *